United States Patent
Kawaguchi

(10) Patent No.: US 6,212,116 B1
(45) Date of Patent: Apr. 3, 2001

(54) SEMICONDUCTOR MEMORY DEVICE

(75) Inventor: Takayuki Kawaguchi, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/525,913

(22) Filed: Mar. 15, 2000

(30) Foreign Application Priority Data

Mar. 16, 1999 (JP) .................................................. 11-070758

(51) Int. Cl.$^7$ ....................................................... G11C 7/00
(52) U.S. Cl. ..................................... 365/203; 365/189.11
(58) Field of Search .............................. 365/203, 189.11, 365/233

(56) References Cited

U.S. PATENT DOCUMENTS

| | | | |
|---|---|---|---|
| 4,985,864 | * 1/1991 | Price | 365/203 |
| 5,053,997 | * 10/1991 | Miyamoto et al. | 365/203 |
| 5,091,889 | * 2/1992 | Hamano et al. | 365/203 |
| 5,093,808 | * 3/1992 | Foss | 365/203 |
| 5,487,044 | 1/1996 | Kawaguchi et al. | |

OTHER PUBLICATIONS

Takayuki Kawaguchi et al., Toshiba Technical Disclosure Bulletin, 97–4553; "Semiconductor Memory Device"; vol. 15–57; Sep. 11, 1997.

* cited by examiner

Primary Examiner—Terrell W. Fears
(74) Attorney, Agent, or Firm—Finnegan, Henderson, Farabow, Garrett, & Dunner, L.L.P.

(57) ABSTRACT

An object of the present invention is to enlarge voltage amplitude of bit lines at a short time when reading out data from memory cells. A semiconductor memory device according to the present invention comprises an initialization circuit 1 constituted of a plurality of memory cells MC1, MC2-MCn, precharge transistors Q2 and Q3, and an equalizing transistor Q1, and a load circuit constituted of load transistors Q4 and Q5. When reading out data from the memory cells MC1-MCn, supply of electric charge to bit lines BLA and BLB by the load transistors Q4 and Q5 is temporarily interrupted. Because of this, it is possible to enlarge the voltage amplitude of the bit lines BLA and BLB from the power supply voltage VDD as compared with the case of always supplying the electric charge to the bit lines BLA and BLB from the power supply voltage VDD. Furthermore, the semiconductor memory device of the present invention interrupts the supply of the electric charge to the bit lines BLA and BLB during writing to the memory cells MC1-MCn. Because of this, it is possible to reduce the current consumption, thereby improving write margin.

18 Claims, 7 Drawing Sheets

F I G. 6A
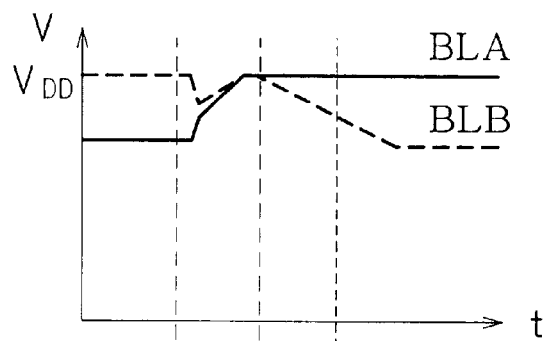
F I G. 6B
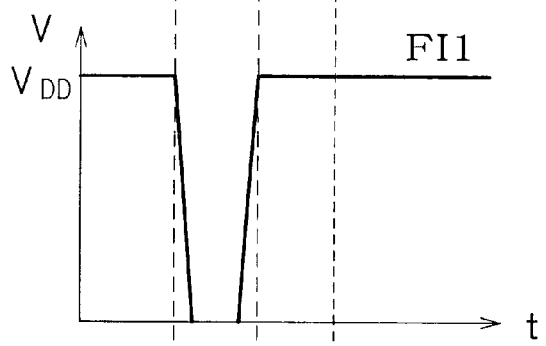
F I G. 6C
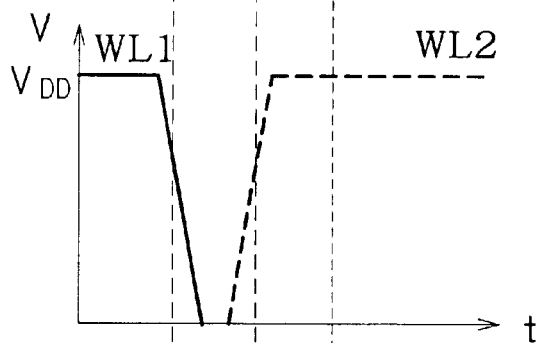
F I G. 6D
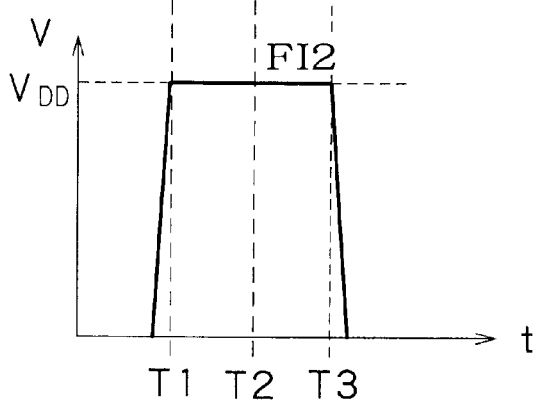

SEMICONDUCTOR MEMORY DEVICE

CROSS REFERENCE TO RELATED APPLICATIONS

The subject application is related to subject matter disclosed in Japanese Patent Application No. H11-70758 filed on Mar. 16, 1999 in Japan to which the subject application claims priority under Paris Convention and which is incorporated herein by reference.

BACKGROUND OF THE INVENTION

1. Field of the Invention

The present invention relates to a semiconductor memory device such as a MOS memory, and more particularly, it relates to a static RAM having a load circuit capable of setting bit lines to an intermediate voltage.

2. Related Background Art

FIG. 1 is a circuit diagram around the bit lines of a conventional static random access memory (SRAM). As shown in FIG. 1, disposed between two bit lines BLA and BLB are a plurality of memory cells MC1, MC2 to MCn, an initialization circuit 1 for initializing the voltages of these bit lines BLA and BLB, and a load circuit 2 capable of setting the bit lines BLA and BLB to an intermediate voltage so that low level voltage of the bit lines BLA and BLB does not lower excessively. Each of these circuits is constituted of MOS transistors.

The initialization circuit 1 includes an equalizing transistor Q1 for short-circuiting both the bit lines BLA and BLB during the address transition of memory cells, that is, when carrying out change-over between selection and non-selection of the memory cells, and precharge transistors Q2 and Q3 for precharging the bit lines BLA and BLB, respectively. The gate terminals of these transistors Q1 to Q3 are all connected to a signal FI1. The voltage level of the signal FI1 is controlled by an address transition detecting circuit (not shown), set to a high level in a stationary state, and temporarily set to a low level during the address transition. That is, the signal to be supplied to the signal FI1 is a one shot pulse signal, and the address transition detecting circuit is constituted of a known one shot pulse generating circuit.

The load circuit 2 has load transistors Q4 and Q5 for setting the low level voltages of the bit lines BLA and BLB to the intermediate voltage, respectively. The gate terminals of these transistors Q4 and Q5 are all connected to a ground terminal, and they are always in an ON state.

The memory cells MC1,MC2-MCn are constituted of, for example, a known circuit as shown in FIG. 2. FIG. 2 shows an example in which the memory cells MC1, MC2 . . . are constituted of two PMOS transistors Q11 and Q12 and four NMOS transistors Q13 to Q16. The NMOS transistors Q13 and Q14 turn on/off in accordance with logic of a word line WL. The transistors Q11 and Q15 are connected in series between a power supply terminal VDD and an ground terminal VSS, and the transistors Q12 and Q16 are connected in series between the power supply terminal VDD and the ground terminal VSS. The gate terminals of the transistors Q1 and Q15 are connected to the drain terminal of the transistor Q14, and the gate terminals of the transistors Q12 and Q16 are connected to the drain terminal of the transistor Q13.

The memory cells MC1 and MC2 of FIG. 1 are both connected to the bit lines BLA and BLB, the memory cell MC1 is connected to a word line WL1, and the memory cell MC2 is connected to a word line WL2.

FIG. 3A is a diagram showing the voltage changes of the bit lines BLA and BLB during the address transition, FIG. 3B is a diagram showing the voltage change of the signal FI1 during the address transition, and FIG. 3C is a diagram showing the voltage changes of the word lines WL1 and WL2 during the address transition. FIG. 3 shows the voltage change in the case of transiting from the status selecting the memory cell MC1 to the status selecting the memory cell MC2 when data "1" is recorded to the memory cell MC2.

Before the address transits, the word line WL1 is an active status, (e.g., high level), and the word line WL2 is an inactive status, (e.g., low level). Because of this, MC1 is selected, the bit line BLA becomes low level, and the bit line BLB becomes high level. In this case, the voltage level of the bit line BLA becomes the intermediate voltage between the power supply voltage VDD and the ground voltage VSS. The reason why the bit line becomes the intermediate voltage is that the load transistors Q4 and Q5 are always in ON state, and the electric charge from the power supply terminal VDD is supplied to the bit line BLA via the load transistors Q4 and Q5.

As described above, by setting the low level voltages of the bit lines BLA and BLB to the intermediate voltage, the voltages of the bit lines BLA and BLB can quickly be raised to an initialized voltage during the address transition as described later. Additionally, the initialized voltage is the same voltage as the power voltage VDD.

On the other hand, when the address transits, the word line WL1 becomes an inactive state, whereby the memory cell MC1 becomes a non-selected state. Moreover, since the signal FI1 reaches the low level during the address transition period, the equalizing transistor Q1 is in ON state, and both of the bit lines try to reach the same voltage. At the same time, the precharge transistors Q2 and Q3 become ON state, and as a result, the bit lines BLA and BLB are charged to reach the same voltage level as the initialized voltage VDD via the precharge transistors Q2 and Q3.

As described above, in the circuit of FIG. 1, by using the equalizing transistor Q1 and precharge transistors Q2 and Q3, while equalizing the bit lines BLA and BLB, and precharging to reach the level of the voltage VDD when the address transits, the bit line voltages are initialized.

Moreover, when the initialization processing of the bit lines BLA and BLB is started (time T1 of FIG. 3), the low level voltages of the bit lines BLA and BLB are set to the intermediate voltage between the power voltage VDD and the ground voltage VSS, and the voltages of the bit lines BLA and BLB can quickly be raised to the initialized voltage VDD.

Subsequently, the signal FI1 showing in FIG. 1 returns to the high level, the equalizing transistor Q1 and precharge transistors Q2 and Q3 are placed in OFF state, and the initialization processing of the bit line voltages is finished. At the same time, the word line WL2 becomes the active state by the address transition, and the memory cell MC2 is selected. When data "1" is stored in the memory cell MC2, the voltage of the bit line BLB reaches the low level, and the voltage of the bit line BLA reaches the high level.

In this case, since the load transistors Q4 and Q5 are in ON state, the voltage of the bit line BLB reaches the intermediate level between the power voltage VDD and the ground voltage VSS.

However, the circuit of FIG. 1 has a problem that the low level voltages of the bit lines BLA and BLB does not quickly lower until the desired voltages after the initialization processing of the bit lines BLA and BLB is finished.

More specifically, in the circuit of FIG. 1, at the same time when the initialization processing of the bit lines BLA and BLB is finished, the word line WL2 becomes the active state. Therefore, the data of the memory cell MC2 is outputted to the bit line BLB, and the bit line BLB reaches the low level. However, since the load transistors Q4 and Q5 are always in ON state, the bit line BlB is always supplied with the electric charge via the load transistors Q4 and Q5. Therefore, the voltage amplitude of the bit line BLB does not increase soon, and an access time delay occurs.

SUMMARY OF THE INVENTION

The present invention has been developed in consideration of the above-described respects, and an object thereof is to provide a semiconductor memory device which can increase the voltage amplitude of bit lines in a short time during change-over between selection and non-selection of memory cells.

To attain the above-described object, according to the present invention, there is provided a semiconductor memory device comprising: first and second bit lines connected to a plurality of memory cells; a load circuit which can supply an electric charge to the first and second bit lines to prevent one of the first and second bit lines from having a voltage equal to or less than a predetermined voltage; and an interrupting control circuit which can interrupt the supply of the electric charge to the first and second bit lines by the load circuit within a predetermined period.

According to the present invention, when the selection and non-selection of the memory cell are changed over, the supply of the electric charge to the first and second bit lines by the load circuit is interrupted during the predetermined period. Therefore, when the memory cell is selected, the voltage amplitudes of the first and second bit lines can be enlarged in a short time, a high-speed access time can be realized, and a high-performance semiconductor memory device can be obtained.

Moreover, in the stationary state of the bit line voltage after the data access, the electric charge is supplied to each bit line via the load circuit. Therefore, either one of the bit lines can be set to an intermediate voltage, and an initializing speed similar to a conventional initializing speed is obtained.

According to another aspect of the present invention, there is provided a semiconductor memory device comprising: first and second bit lines connected to a plurality of memory cells; a load circuit which can supply an electric charge to the first and second bit lines to prevent one of the first and second bit lines from having a voltage equal to or less than a predetermined voltage when at least one of writing and reading is performed on the selected memory cell; and an interrupting control circuit which can interrupt the supply of the electric charge to the first and second bit lines by the load circuit.

According to the present invention, because the electric charge is not supplied to the first and second bit lines during writing to the memory cells, no current flows to the first and second bit lines, thereby reducing power consumption. At the same time, it is possible to set the low level voltage during writing to the memory cells to substantially the same voltage as the ground level voltage. Accordingly, it is possible to stabilize the low level voltage for writing to the memory cell, thereby improving a write margin.

Furthermore, when reading out data from the memory cells, by temporarily interrupting the supply of the electric charge to the first and second bit lines, it is possible to quickly lower the low level voltage of the first and second bit lines, thereby speeding up access time for the memory cells.

BRIEF DESCRIPTION OF THE DRAWINGS

FIGS. 6A to 6D are timing charts of the semiconductor memory device of FIG. 5.

DETAILED DESCRIPTION OF THE PREFERRED EMBODIMENTS

A semiconductor memory device of the present invention will specifically be described hereinafter with reference to the drawings.

The following embodiment has a feature that the supply of the electric charge to the bit lines is temporarily interrupted at least one during reading out from the memory cells and writing to the memory cells.

Figure 4:
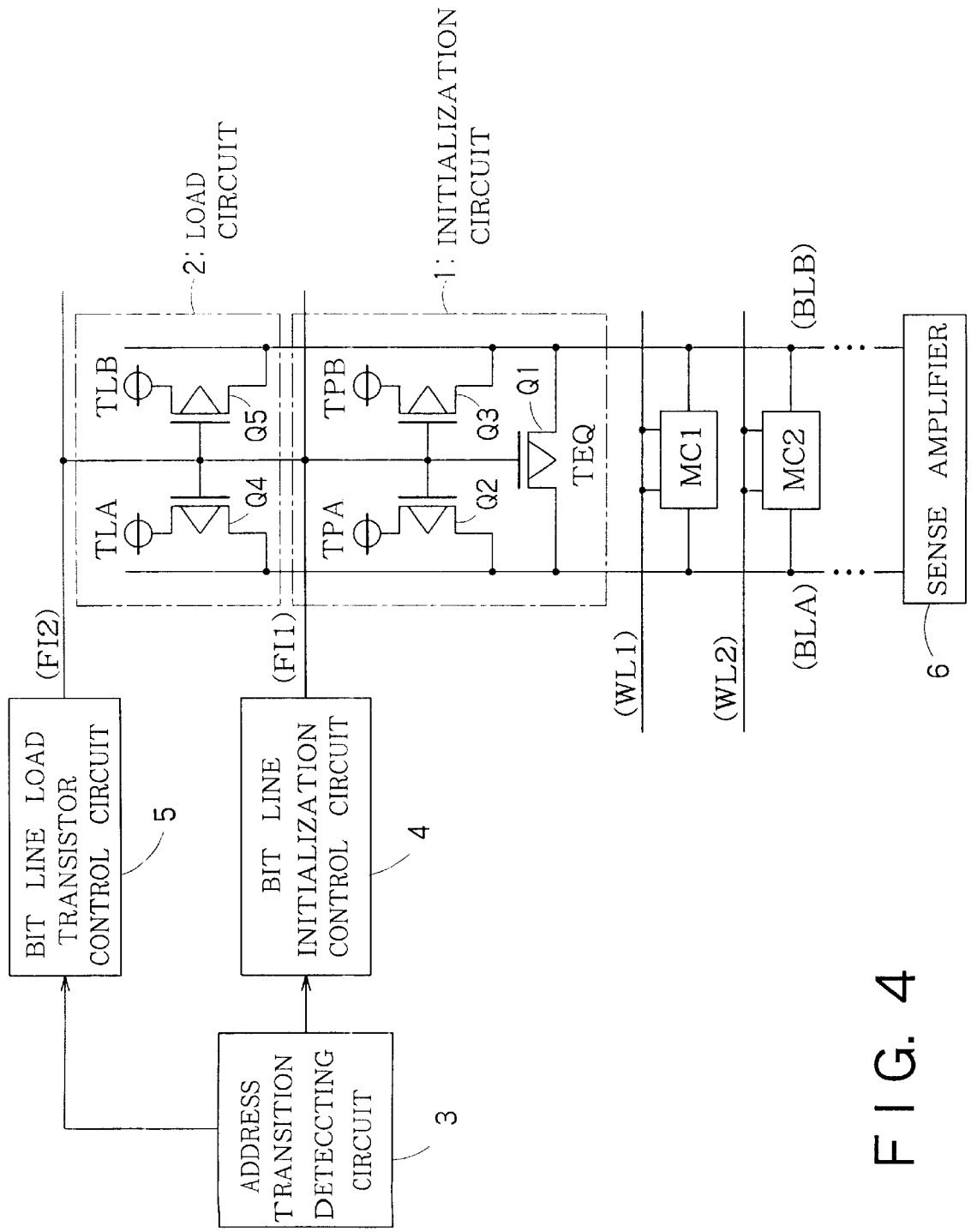
FIG. 4 is a circuit diagram of a first embodiment of a semiconductor memory device according to the present invention.

FIG. 4 is a circuit diagram showing an embodiment of the semiconductor memory device according to the present invention. FIG. 4 shows the internal constitution of a static random access memory (SRAM).

Figure 1:
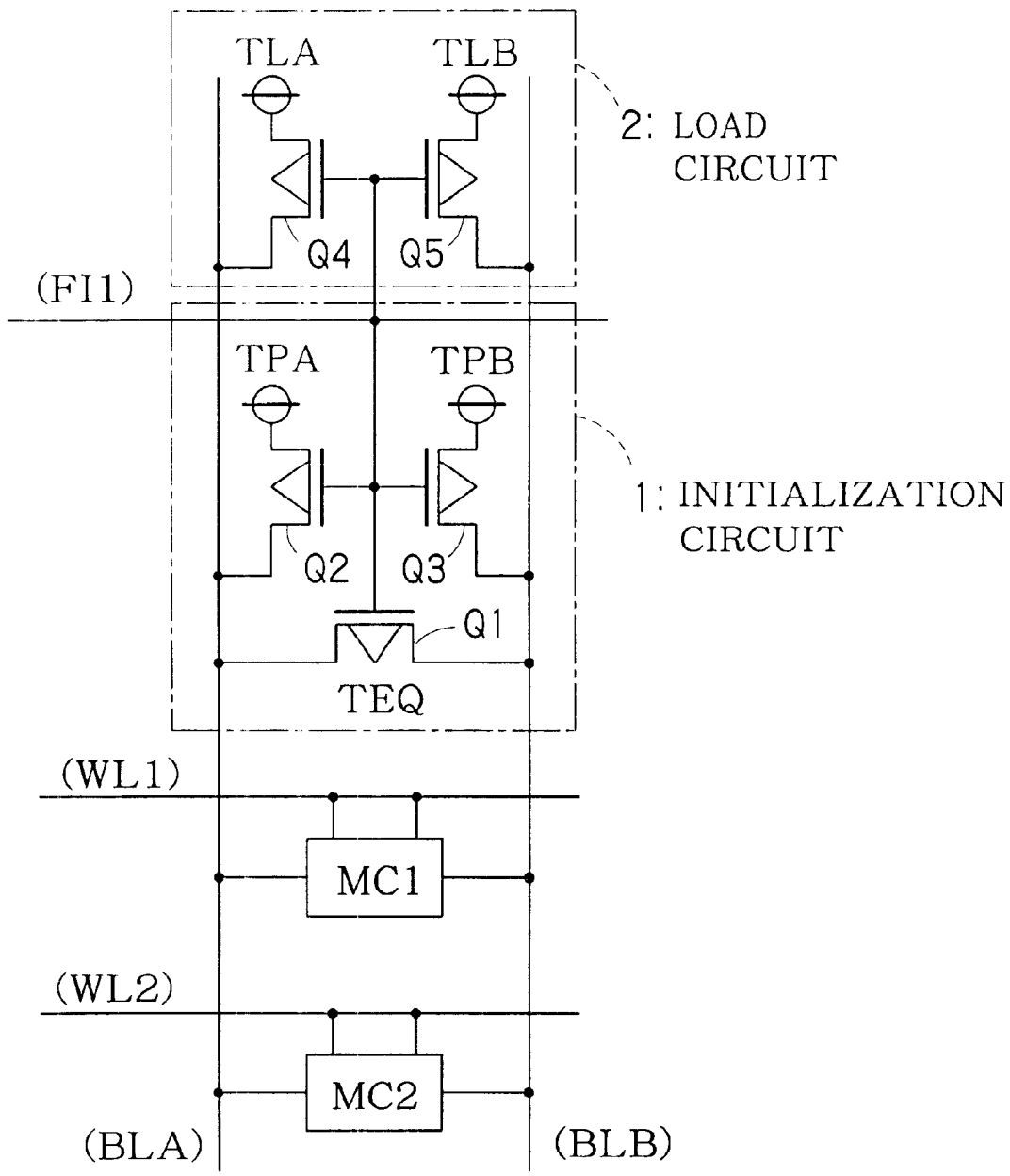
FIG. 1 is a circuit diagram in the periphery of a bit line of a conventional Static Random Access memory (SRAM).

The semiconductor memory device of FIG. 4, similarly to FIG. 1, has a constitution in which a plurality of memory cells MC1,MC2-MCn, an initialization circuit 1, and load circuit 2 constituted of load transistors Q4 and Q5 are connected between two bit lines BLA and BLB. Disposed in the initialization circuit 1 are precharge transistors Q2 and Q3, and equalizing transistor Q1.

Additionally, the semiconductor memory device of FIG. 4 comprises an address transition detecting circuit 3 for detecting address transition, a bit line initialization control circuit 4 for outputting a signal FI1 to initialize each transistor in the initialization circuit 1, and a bit line load transistor control circuit (interrupting control circuit) 5 for outputting a signal FI2 to initialize each transistor in the load circuit 2.

The memory cells MC1,MC2-MCn are connected to the respective word lines WL1 and WL2, . . . WLn. Either one of the memory cells is selected by setting either of the word lines to a predetermined signal level. FIG. 4 shows an example in which the word line WL1 is connected to the memory cell MC1 and the word line WL2 is connected to the memory cell MC2.

The signal FI1 is normally in high level, and it is set temporarily to low level during reading out from the memory cells MC1, MC2 . . . MCn and after writing to the memory cells MC1, MC2 . . . MCn. When the signal FI1 is in low level, the bit lines BLA and BLB is set to the initialization voltage identical to each other.

The bit line load transistor control circuit 5 sets the signal FI2 to low level during the stationary state, and sets it to high level temporarily during reading out data from the memory cells MC1-MCn and continuously during writing data to the memory cells MC1-MCn.

When the signal FI2 is in low level, the load transistors Q4 and Q5 turn on, and the operation for raising the low level voltage of the bit lines BLA and BLB until it reaches the intermediate voltage is carried out. By this operation, it is possible to quickly raise the bit line voltages to the initialization voltage during the address transition.

On the other hand, when the signal FI2 becomes high level, the load transistors Q4 and Q5 turn off, the bit lines BLA and BLB are supplied with no electric charge from the power supply terminal VDD. By setting to high level the signal FI2 continuously during writing to the memory cells MC1-MCn, no current flows from the load circuit 2 through the bit lines BLA and BLB, thereby reducing the power consumption. At the same time, it is possible to set the low level voltage during writing to the memory cells MC1-MCn to the ground level, thereby improving the write margin.

Furthermore, by setting the signal FI2 to high level temporarily during reading out from the memory cells MC1-MCn, it is possible to quickly lower the lower voltage of the bit lines BLA and BLB, thereby speeding up the access time.

Figure 2:
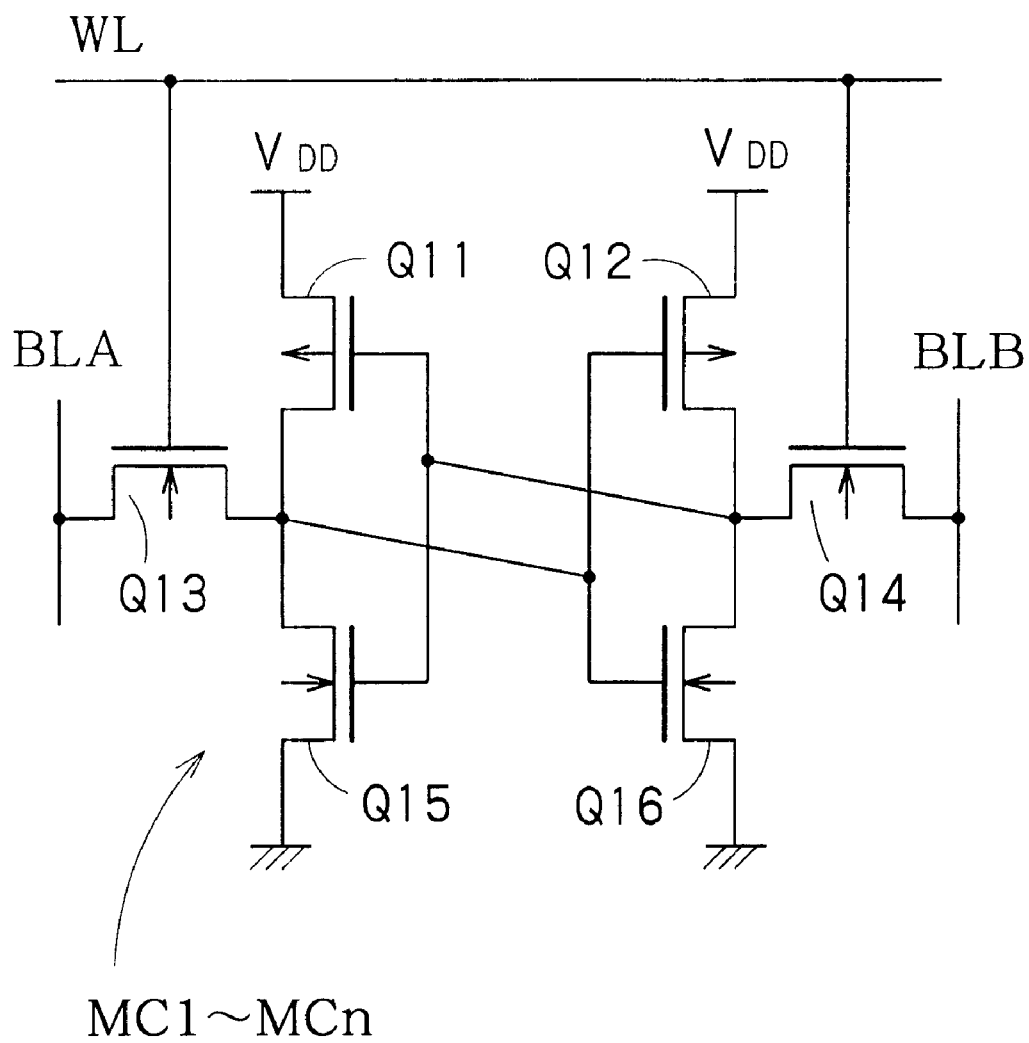
FIG. 2 is a diagram showing an example in which memory cells MC1, MC2-MCn are constituted of two PMOS transistors Q11 and Q12 and four NMOS transistors Q13 to Q16.
Figure 3A:
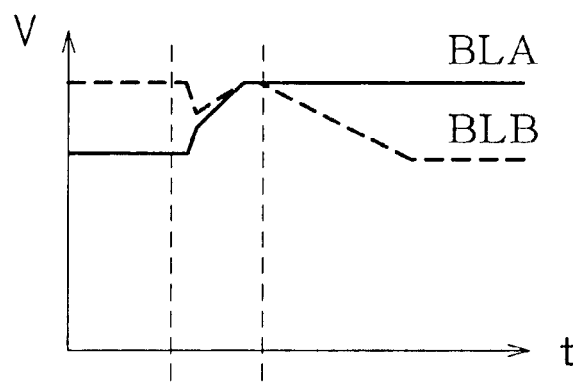
FIG. 3A is a diagram showing the voltage change of bit lines BLA and BLB during address transition.
Figure 3B:
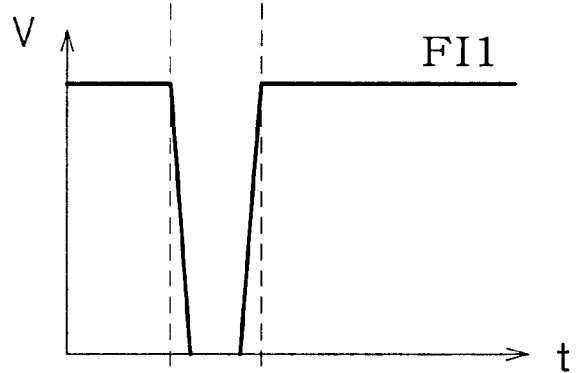
FIG. 3B is a diagram showing the voltage change of a signal FI1 during the address transition.
Figure 3C:
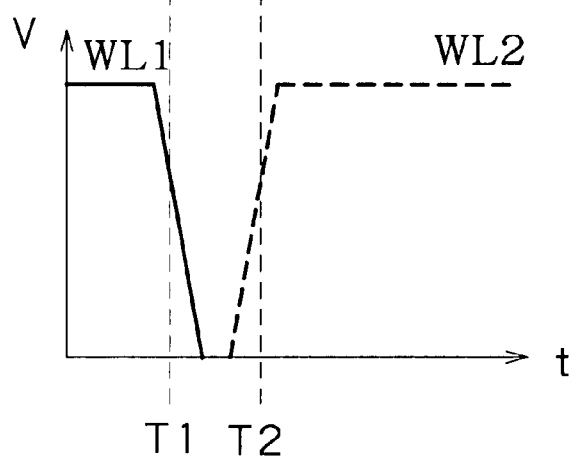
FIG. 3C is a diagram showing the voltage change of word lines WL1 and WL2 during the address transition.

The memory cells MC1,MC2-MCn of FIG. 4 are constituted in a similar manner as FIG. 2. When data "0" is stored, the bit line BLA reaches the low level, and the bit line BLB reaches the high level during reading out from the memory cells. When data "1" is stored, the bit line BLB reaches the low level, and the bit line BLA reaches the high level during reading out from the memory cells.

That is, when the data of the memory cells MC1,MC2-MCn are read out from the memory cells, either one of the bit lines BLA and BLB reaches the low level, and the other bit line reaches the high level in accordance with the stored data logic. The data read from the memory cells MC1,MC2-MCn are amplified by a sense amplifier 6 connected to one ends of the bit lines BLA and BLB in order read to the outside.

Figure 5:
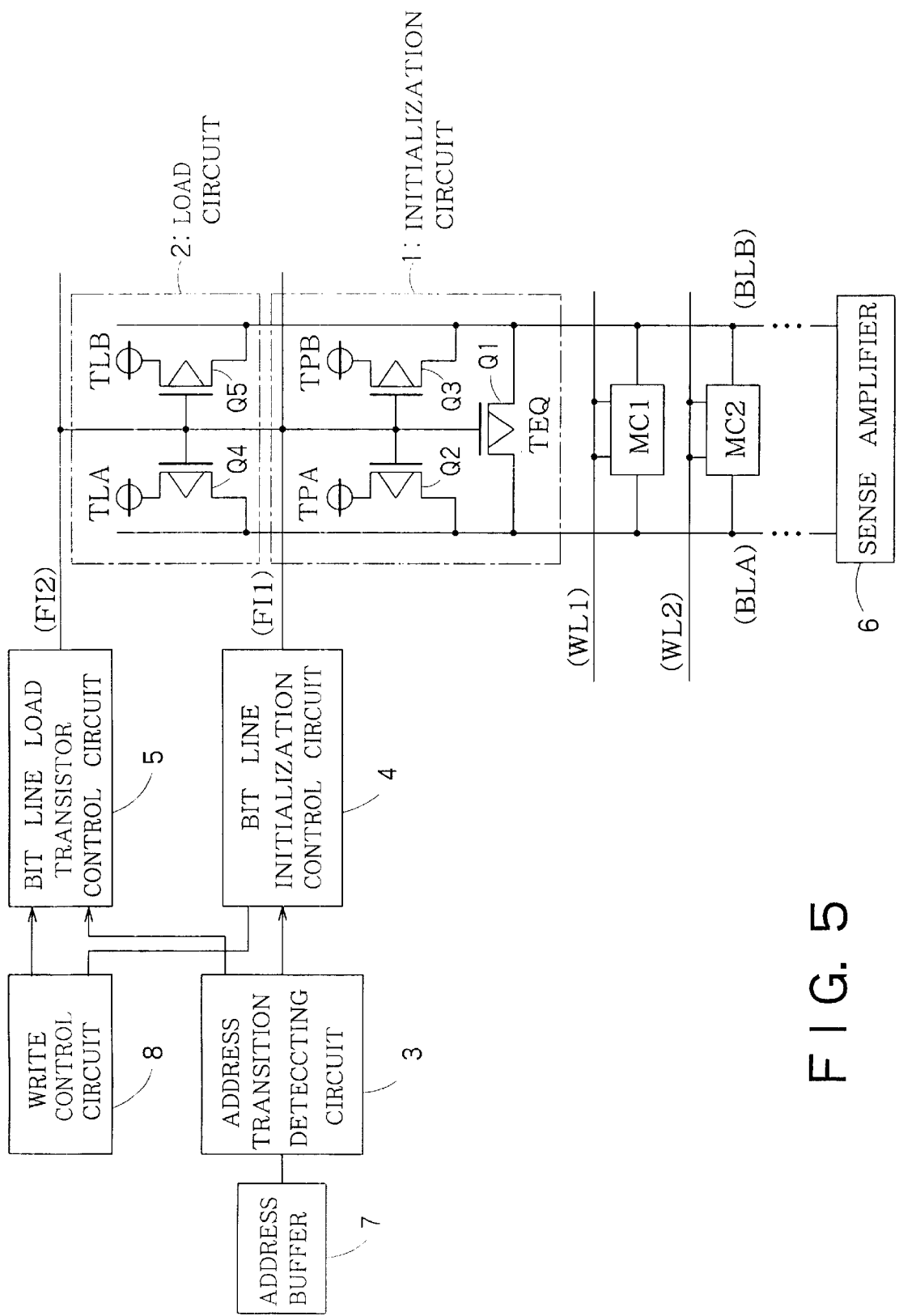
FIG. 5 is a block diagram showing one example of the detailed constitution of the semiconductor memory device of FIG. 4.

FIG. 5 is a block diagram showing one example of the detailed constitution of the semiconductor memory device of FIG. 4. As shown in FIG. 5, the address transition detecting circuit 3 detects the address transition based on an output signal from an address buffer 7 and generates the signal FI0 showing the detecting result. The bit line load transistor control circuit 4 detects the address transition or the write end to the memory cells in order to generate the signal FI1, based on the output signal from the signal FI0 or the write control circuit 8.

The bit line load transistor control circuit 5 detects the address transition or the writing to the memory cells in order to generate the signal FI2, based on the signal FI0 from the address transition detecting circuit 3 or the output signal from the write control circuit 8. Here, "writing" includes not only a case in which the data is first written to the memory cells but also a case in which the data is rewritten to the same memory cell.

As described above, in the first embodiment, because the supply of the electric charge to the bit lines BLA and BLB by the load transistors Q4 and Q5 is interrupted temporarily during the writing/reading to/from the memory cell, the voltage amplitudes of the bit lines BLA and BLB can be increased in a short time, as compared with when the electric charge is constantly supplied to the bit lines BLA and BLB from the power voltage VDD as in the conventional art. Furthermore, because the supply of the electric charge to the bit lines BLA and BLB is interrupted continuously during writing to the memory cells MC1-MCn, it is possible to reduce the power consumption and to improve the write margin.

FIG. 6 is a timing chart of the semiconductor memory device of FIG. 5. Hereinafter, the operation of the semiconductor memory device of FIG. 5 will be described with reference to FIG. 6. Hereinafter, supposing that the data "0" is stored in the memory cell MC1, the data "1" is stored in the memory cell MC2, and the selected state of the memory cell MC1 is changed to the selected state of the memory cell MC2 by the address transition, the operation of FIG. 5 will be described.

Before the address transition, the word line WL1 is in the active state, the word line WL2 is in the inactive state, and the memory cell MC1 is selected. Since the data "0" is stored in the memory cell MC1, during reading out data from the memory cell MC1, the bit line BLA reaches the low level, and the bit line BLB reaches the high level. Moreover, since the signal FI2 is at the low level in the stationary state, the load transistors Q4 and Q5 turn on, the electric charge from the power voltage VDD is supplied to the bit line BLA of the low level, and the voltage of the bit line BLA becomes a intermediate level between the power voltage VDD and the ground voltage VSS.

Thus, by setting the voltage of the bit line BLA of the low level to the intermediate level, the bit line BLA can quickly be raised to the initialized voltage VDD during the address transition.

Subsequently, the state after the address transition will be described. First, when the address changes, the word line WL1 becomes the inactive state at the time T1, and the memory cell MC1 becomes the non-selected state. At the same time, the signal FI2 changes to the high level, and both of the load transistors Q4 and Q5 turn off. As a result, the supply of the electric charge to the bit lines BLA and BLB by the load transistors Q4 and Q5 is interrupted.

Furthermore, at the same time, the signal FI1 changes to the low level, and the equalizing transistor Q1 turns on. As a result, the bit lines BLA and BLB short-circuit to each other, and the bit lines BLA and BLB try to reach the same potential. Moreover, the precharge transistors Q2 and Q3 also turn on, the bit lines BLA and BLB are both charged to the power voltage VDD, and the bit lines BLA and BLB are initialized.

Subsequently, at the time T2 of FIG. 6, the signal FI1 reaches the high level, the equalizing transistor Q1 and precharge transistors Q2 and Q3 turn off, and the initialization processing of the bit lines BLA and BLB is finished.

At the same time, the word line WL2 becomes the active state, the memory cell MC2 is selected, and data of the memory cell MC2 is outputted to the bit line BLB. For example, when the data "1" is stored in the memory cell MC2, the bit line BLA reaches the high level, and the bit line BLB reaches the low level.

Since the signal FI2 is in the high level at this time, the supply of the electric charge to the bit lines BLA and BLB by the load transistors Q4 and Q5 remains to be interrupted. Therefore, when the voltage of the bit line BLB reaches the low level by the data access, the bit line BLB is quickly discharged to the low level.

As a result, the voltage amplitude of data read out from the bit line BLB can be increased in a short time, and the high-speed access time can be realized.

Next, at time T3 of FIG. 6, the signal FI2 reaches the low level, and the load transistors Q4 and Q5 are placed in ON state. Therefore, the electric charge is supplied to the bit lines BLA and BLB from the power supply terminal VDD via the load transistors Q4 and Q5. As a result, the voltage of the bit line BLB with the low level reaches the intermediate level between the power voltage VDD and the ground voltage VSS.

Figure 7:
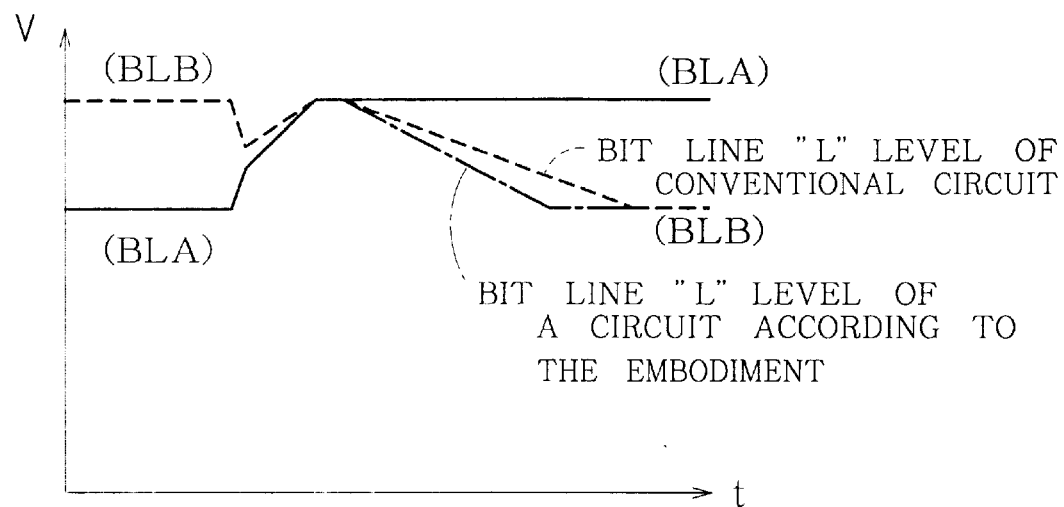
FIG. 7 is a diagram showing a result comparing the voltage change of the bit line BLB during reading out data between the circuit of the present embodiment and the conventional circuit.

FIG. 7 is a diagram showing a result comparing the voltage change of the bit line BLB during reading out data between the circuit of the present embodiment and the conventional circuit. A dotted line shows the voltage amplitude of reading-out data of the conventional bit line BLB, and a dashed line shows the voltage amplitude of reading-out data of the bit lines according to the present invention.

As shown in FIG. 7, immediately after the bit line initialization processing by the equalizing transistor Q1 and precharge transistors Q2 and Q3 is finished, and then the word line WL2 is activated, the voltage amplitude of the bit line BLB increases as compared with the conventional amplitude.

Thus, in the present embodiment, immediately after the word line WL2 activates, the supply of the electric supply to the bit line BLB by the load transistors Q4 and Q5 is temporarily interrupted. Because of this, it is possible to increase the voltage amplitude of the bit line BLB at a shorter time as compared with the conventional case of supplying the electric charge to the bit line BLB from the power supply voltage VDD.

Furthermore, in the present embodiment, during the stationary state of the bit line BLB after data access, the load transistors Q4 and Q5 turn on, similarly to the conventional circuit. Because of this, the voltage of the bit line BLB becomes the intermediate voltage level between the power supply voltage VDD and the ground voltage VSS, similarly to the conventional circuit. As a result, it is possible to obtain the advantageous effect similar to the conventional circuit, thereby improving the access speed.

Incidentally, the time T3 when the signal FI2 turns to low level after address of the memory cells MC1, MC2-MCn transits may be predetermined based on the time when the voltage of the bit line BLB lowers the predetermined voltage from the power supply voltage VDD. Otherwise, the time T3 may be predetermined based on the time when the output logic of the sense amplifier 6 inverts. The time when the signal FI2 is set to high level may be any time between the time T1 and T2.

Figure 8:
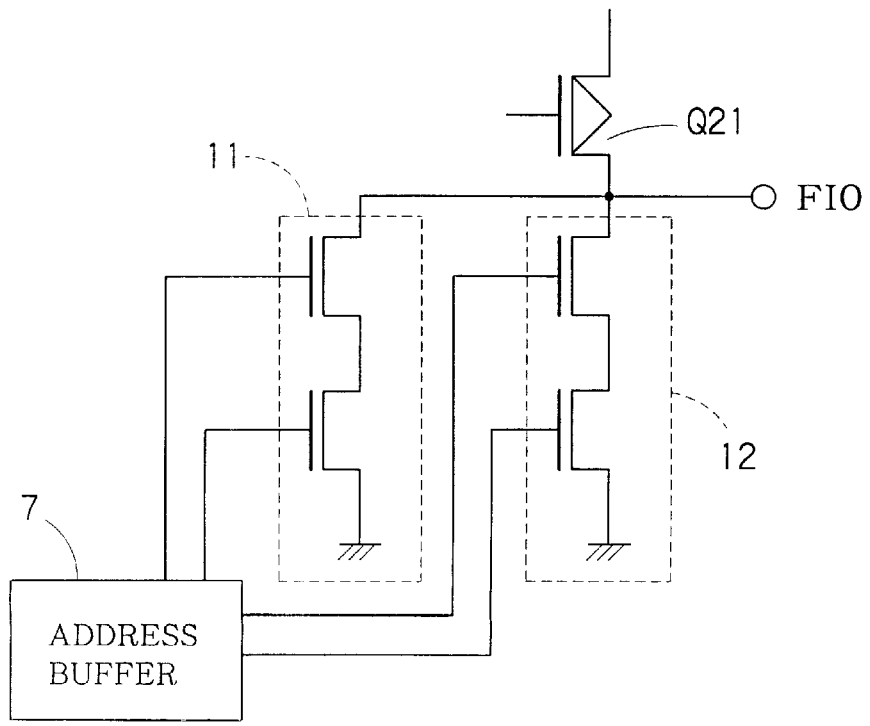
FIG. 8 is a circuit diagram showing one example of an address transition detecting circuit 3 of FIG. 5.

FIG. 8 is a diagram showing one example of the address transition detecting circuit 3 of FIG. 5. The address transition detecting circuit 3 includes two transistor strings 11 and 12, and a PMOS transistor Q21 connected to one end of each of the transistor strings 11 and 12.

When the address transits, the output signal FI0 of the address transition detecting circuit 3 turns on temporarily. The signal FI0 is inputted to the bit line initialization control circuit 4 and the bit line load transistor control circuit 5 of FIGS. 4 and 5, in order to generate the signal FI1 and FI2 with logic in accordance with the signal FI0.

In the above-described embodiment, the example has been described in which the bit lines BLA and BLB are both set to the high level before the address transition, and either one bit line is set to the low level in accordance with the logic of the data stored in the memory cells MC1 and MC2. Conversely, the bit lines BLA and BLB may both be set to the low level before the address transition, and either one bit line may be set to the high level in accordance with the logic of the data stored in the memory cells MC1 and MC2. In this case, the initialization circuit 1 or the load circuit 2 may be constituted of an NMOS transistor, and the logic of the pulse inputted to each transistor gate terminal may be in reverse to that of the circuit of FIG. 1.

In the above-described embodiment, the example in which the present invention is applied to an SRAM has been described, but the present invention can also be applied to various memory ICs besides the SRAM.

What is claimed is:

1. A semiconductor memory device comprising:

first and second bit lines connected to a plurality of memory cells;

load means capable of supplying electric charge to said first and second bit lines so that voltages of said first and second bit lines do not become equal to or less than a predetermined voltage; and an interrupting control circuit capable of interrupting supply of the electric charge to said first and second bit lines by said load means during a predetermined period.

2. The semiconductor memory device according to claim 1, wherein said interrupting control circuit interrupts the supply of the electric charge to said first and second bit lines by said load means, during said predetermined period from the time beginning a selecting operation of said memory cells, and then restarts the supply of the electric charge to said first and second bit lines.

3. The semiconductor memory device according to claim 1, wherein said interrupting control circuit interrupts the supply of the electric charge to said first and second bit lines at timing when the word line of a selected state turns to an unselected state.

4. The semiconductor memory device according to claim 1, further comprising:

an initialization circuit for temporarily short-circuiting said first and second bit lines, and setting voltages of these bit lines to an initialization voltage predetermined in advance, wherein said interrupting control circuit interrupts the supply of the electric charge to said first and second bit lines at timing when voltages of said first and second bit lines become equal substantially to said initialization voltage.

5. The semiconductor memory device according to claim 1, wherein said interrupting control circuit restarts the supply of the electric charge to said first and second bit lines after a lapse of a predetermined period from the time when the word line is selected.

6. The semiconductor memory device according to claim 1, further comprising:

a sense amplifier for amplifying data read out from said memory cells, wherein said interrupting control circuit restarts the supply of the electric charge to said first and second bit lines after output logic of said sense amplifier changes.

7. A semiconductor memory device comprising:

first and second bit lines connected each of a plurality of memory cells;

load means capable of supplying electric charge to said first and second bit lines so that voltages of said first and second bit lines do not become equal to or less than a predetermined voltage; and an interrupting control circuit for interrupting supply of the electric charge to said first and second bit lines by said load means during writing to said memory cells, and interrupting the supply of the electric charge to said first and second bit lines during a predetermined period when reading out data from said memory cells.

8. The semiconductor memory device according to claim 7, wherein said interrupting control circuit interrupts the supply of the electric charge to said first and second bit lines by said load means during said predetermined period from the time beginning a selecting operation of said memory cells, and then restarts the supply of the electric charge to said first and second bit lines.

9. The semiconductor memory device according to claim 7, wherein said interrupting control circuit interrupts the supply of the electric charge to said first and second bit lines at timing when the word line of a selected state becomes an unselected state.

10. The semiconductor memory device according to claim 7, further comprising:

an initialization circuit for short-circuiting said first and second bit lines and setting these bit lines to an initialization voltage predetermined in advance, wherein said interrupting control circuit interrupts the supply of the electric charge to said first and second bit lines at timing when the voltages of said first and second bit lines become equal to said initialization voltage.

11. The semiconductor memory device according to claim 7, wherein said interrupting control circuit restarts the supply of the electric charge to said first and second bit lines after a lapse of a predetermined period from the time when the word line of an unselected state becomes a selected state.

12. The semiconductor memory device according to claim 7, further comprising:

a sense amplifier for amplifying data read out from said memory cells, wherein said interrupting control circuit restarts the supply of the electric charge to said first and second bit lines after the output logic of said sense amplifier changes.

13. A semiconductor memory device comprising:

first and second bit lines connected to each of a plurality of memory cells;

load means capable of supplying electric charge to said first and second bit lines so that voltages of said first and second bit lines do not become equal to or less than a predetermined voltage; and an interrupting control circuit capable of interrupting the supply of the electric charge to said first and second bit lines by said load means during a predetermined period, when carrying out change-over between selection and non-selection of the memory cells.

14. The semiconductor memory device according to claim 13, wherein said interrupting control circuit interrupts the supply of the electric charge to said first and second bit lines by said load means during said predetermined period from the time when a selecting operation of said memory cells is begun, and then restarts the supply of the electric charge to said first and second bit lines.

15. The semiconductor memory device according to claim 13, wherein said interrupting control circuit interrupts the supply of the electric charge to said first and second bit lines at timing when the word line of a selected state becomes an unselected state.

16. The semiconductor memory device according to claim 13, further comprising:

an initialization circuit for short-circuiting said first and second bit lines and setting these bit lines to an initialization voltage predetermined in advance, wherein said interrupting control circuit interrupts the supply of the electric charge to said first and second bit lines at timing when the voltages of said first and second bit lines become equal to said initialization voltage.

17. The semiconductor memory device according to claim 13, wherein said interrupting control circuit restarts the supply of the electric charge to said first and second bit lines after a lapse of a predetermined period from the time when the word line of an unselected state becomes a selected state.

18. The semiconductor memory device according to claim 13, further comprising:

a sense amplifier for amplifying data read out from said memory cells, wherein said interrupting control circuit restarts the supply of the electric charge to said first and second bit lines after output logic of said sense amplifier changes.

* * * * *